United States Patent
Lin et al.

(10) Patent No.: US 9,263,595 B2
(45) Date of Patent: Feb. 16, 2016

(54) NON-VOLATILE MEMORIES AND METHODS OF FABRICATION THEREOF

(71) Applicant: Taiwan Semiconductor Manufacturing Company, Ltd., Hsin-Chu (TW)

(72) Inventors: Chih-Wei Lin, Taoyuan (TW); Yi-Fang Lee, Taichung (TW); Cheng-Ta Wu, Shueishang Township (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 68 days.

(21) Appl. No.: 13/948,998

(22) Filed: Jul. 23, 2013

(65) Prior Publication Data
US 2013/0307045 A1   Nov. 21, 2013

Related U.S. Application Data

(62) Division of application No. 12/714,194, filed on Feb. 26, 2010, now Pat. No. 8,501,610.

(60) Provisional application No. 61/173,434, filed on Apr. 28, 2009.

(51) Int. Cl.
*H01L 29/788* (2006.01)
*H01L 21/28* (2006.01)
*H01L 27/115* (2006.01)
*H01L 29/423* (2006.01)
*H01L 29/51* (2006.01)

(52) U.S. Cl.
CPC ........ *H01L 29/788* (2013.01); *H01L 21/28273* (2013.01); *H01L 27/11521* (2013.01); *H01L 29/42324* (2013.01); *H01L 29/513* (2013.01); *H01L 29/7881* (2013.01)

(58) Field of Classification Search
CPC ................... H01L 21/28273; H01L 27/11521; H01L 29/788
USPC .................................................. 257/314–326
See application file for complete search history.

(56) References Cited

U.S. PATENT DOCUMENTS

| | | | | |
|---|---|---|---|---|
| 5,939,763 | A * | 8/1999 | Hao et al. ....................... | 257/411 |
| 6,596,585 | B2 * | 7/2003 | Kobayashi et al. ........... | 438/257 |
| 7,183,143 | B2 | 2/2007 | Wang | |
| 7,405,453 | B2 * | 7/2008 | Shero et al. ................... | 257/410 |
| 7,772,072 | B2 | 8/2010 | Wang et al. | |
| 2006/0054980 | A1 | 3/2006 | Kim et al. | |
| 2008/0093658 | A1 | 4/2008 | Shiozawa et al. | |
| 2009/0174013 | A1 | 7/2009 | Shimizu | |
| 2009/0253242 | A1 | 10/2009 | Joo et al. | |

\* cited by examiner

*Primary Examiner* — Ori Nadav
(74) *Attorney, Agent, or Firm* — Slater & Matsil, L.L.P.

(57) ABSTRACT

Non-volatile memories and methods of fabrication thereof are described. In one embodiment, a method of fabricating a semiconductor device includes forming an oxide layer over a semiconductor substrate, and exposing the oxide layer to a first nitridation step to form a first nitrogen rich region. The first nitrogen rich region is disposed adjacent an interface between the oxide layer and the semiconductor substrate. After the first nitridation step, the oxide layer is exposed to a second nitridation step to form a second nitrogen rich region. A first gate electrode is formed on the oxide layer, wherein the second nitrogen rich region is disposed adjacent an interface between the oxide layer and the first gate electrode.

20 Claims, 15 Drawing Sheets

NON-VOLATILE MEMORIES AND METHODS OF FABRICATION THEREOF

This application is a divisional of U.S. patent application Ser. No. 12/714,194, filed Feb. 26, 2010, and entitled "Non-Volatile Memories and Methods of Fabrication Thereof," which application further claims the benefit of U.S. Provisional Application No. 61/173,434, filed Apr. 28, 2009, and entitled "Non-Volatile Memories and Methods of Fabrication Thereof," which applications are incorporated herein by reference.

TECHNICAL FIELD

The present invention relates generally to semiconductor devices, and more particularly to non-volatile memories and methods of fabrication thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

One type of semiconductor device is a memory device, in which data is typically stored as a logical "1" or "0." A memory device may be static or dynamic. A dynamic memory device needs to be refreshed to "remember" the data, whereas a static memory device does not need to be refreshed to retain stored data.

One type of static memory device, also referred to in the art as a non-volatile memory (NVM) device, is a floating gate memory device. A floating gate memory device can be either erasable programmable read-only memory (EPROM) or electrically erasable programmable read-only memory (EEPROM). Both these type of floating gate memories rely on a charge stored in the floating gate (or a charge trap layer) by suitable application of a bias to the various terminals of the device. The charge may be stored by a number of mechanisms such as carrier tunneling and/or injection. The charge may be removed either electrically as in EEPROM devices or by an external source such as an ultra violet light. The presence of this charge in the floating gate determines the state of the memory as logical "1" or "0." Flash EEPROM memories are called such due to their fast program and erase times (as in a lightning flash).

The floating gate devices are usually stacked in large arrays to form memory cells such as flash memory cells. Based on the stacking or layout of the floating gate transistors, flash memory may comprise a NOR, NAND, or an AND memory architecture. As an example, most commercial memory cards such as memory sticks comprise NAND flash memory cells. Flash memory is among the most popular memories available in the market today. The popularity of flash memory arises partly due to its compatibility with existing CMOS process flows. Flash memory is simply a field effect transistor, except it has a poly-silicon floating gate sandwiched between a tunnel oxide and an inter-poly oxide to form a charge storage layer. However, flash memory devices have some disadvantages or bottlenecks that need to be overcome for continued success.

As circuit designs become more complex and increased processing speeds are demanded, it is becoming increasingly more important and necessary to be able to provide larger numbers of transistors on an integrated circuit (IC) chip without increasing the overall size of the IC chip. One technique for increasing circuit density is to scale down the size of each individual MOSFET device on the IC chip. The performance of the MOSFET device is inversely proportional to the gate oxide thickness. Efforts to enhance performance, therefore, have driven gate oxide thicknesses down, for example, below 14 Å. Scaling of the gate oxides to such thicknesses, however, leads to high tunneling currents and consequently poor charge retention.

An alternative approach to extreme scaling of oxide thicknesses is the incorporation of nitrogen into the gate oxide. Addition of nitrogen increases the dielectric constant of the gate dielectric over conventional silicon oxide, thereby reducing the effective oxide thickness while reducing gate leakage current. However, nitrogen also increases traps within the dielectric and results in poor reliability or product lifetime.

Hence, what are needed are dielectrics and means to form dielectrics for non-volatile memories that increase charge retention without a decrease in product lifetime.

SUMMARY OF THE INVENTION

These and other problems are generally solved or circumvented, and technical advantages are generally achieved, by preferred embodiments of the present invention.

Embodiments of the invention include non-volatile memories and methods of fabrication thereof. In accordance with an embodiment of the present invention, a method of forming a semiconductor device comprises forming an oxide layer over a semiconductor substrate and exposing the oxide layer to a first nitridation step to form a first nitrogen rich region. The first nitrogen rich region is disposed adjacent an interface between the oxide layer and the semiconductor substrate. After the first nitridation step, the oxide layer is exposed to a second nitridation step to form a second nitrogen rich region. A first gate electrode is formed on the oxide layer, wherein the second nitrogen rich region is disposed adjacent an interface between the oxide layer and the first gate electrode.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1d, illustrates a structural embodiment of a non-volatile memory device, in accordance with embodiments of the invention, wherein FIG. 1a illustrates a top view, wherein FIGS. 1b and 1c illustrate cross-sectional views, and wherein FIG. 1d is a schematic illustration of nitrogen profile in the gate dielectric of the memory device;

FIG. 2, which includes

FIG. 3, which includes FIG. 4, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
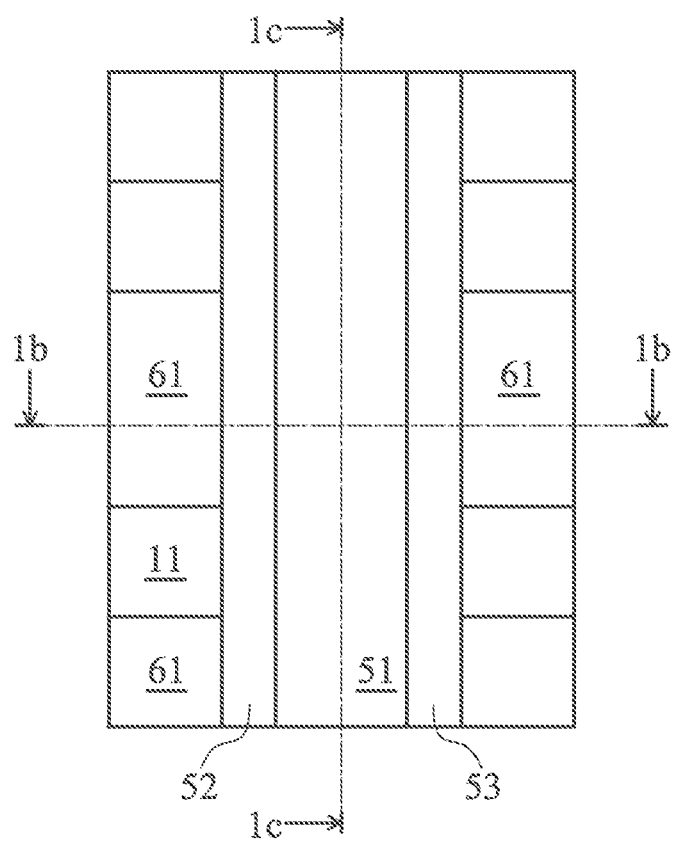

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a non-volatile memory device. The invention may also be applied, however, to other devices including other semiconductor devices such as field effect transistors.

Device scaling is essential for continued success of any technology including non-volatile memories such as flash. Device scaling enables formation of more devices per area while improving and/or maintaining key electrical metrics such as program, erase, retention, and read times. This translates into improved product performance at lower cost, thus enabling increased consumption. This typically involves scaling device geometries (such as channel length) to enable operation at, for example, lower power, lower voltages, etc.

Unlike CMOS devices, non-volatile memories have another limitation imposed by the retention time of the trapped charge in the floating gate (or charge trap layer). Ideally, a flash memory cell constrains a trapped charge forever. However, in reality, the trapped charge can tunnel back into the semiconductor channel or control gate during the "off" state of the device. This would result in the loss of stored information. Flash devices sold in the market are expected to store information for at least 10 years. Consequently, this imposes a lower limit on the thickness of the tunnel oxide. Hence, the tunnel oxides in flash devices are at least 6 nm thick and typically around 8 nm to 10 nm. A thicker gate stack dielectric requires a higher operating voltage to ensure program and erase operations. A higher operating voltage (especially on the drain or source side) combined with a thicker dielectric reduces gate control of the channel and hence creates excessive short channel effects. Consequently, this prohibits channel length scaling due to an increase in unwanted leakage currents. Further, higher operating voltages require larger select gate transistors, again reducing device density. In various embodiments, the invention overcomes these limitations by forming a gate dielectric with a high dielectric constant by improving the nitrogen profile in the gate dielectric.

Another requirement of non-volatile memories is endurance. Endurance is the number of erase and program cycles that the memory can be subjected to before failure. For example, some products require ability to withstand more than 100,000 erase and program cycles. Increased endurance helps to improve product reliability by increasing the expected life time of the product. Endurance is primarily limited by time-dependent-dielectric-breakdown (TDDB), and/or charge-trapping. In general, an increase in nitrogen concentration increases retention time by effectively decreasing the tunnel current, but reduces endurance. In various embodiments, the nitrogen profile in the gate dielectric is used to increase retention time, while mitigating or even improving the endurance of the memory device.

A structural embodiment of the transistor device is described in FIGS. 1 and 3, and various methods for the formation of transistor devices using these concepts will then be described with respect to the cross-sectional views of FIGS. 2 and 4.

Figure 1B:
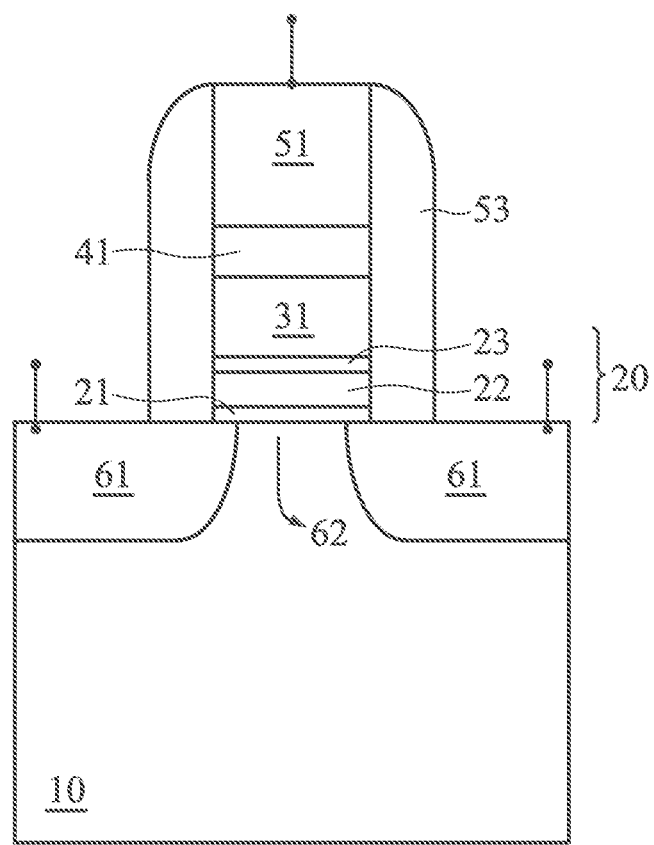
Figure 1C:
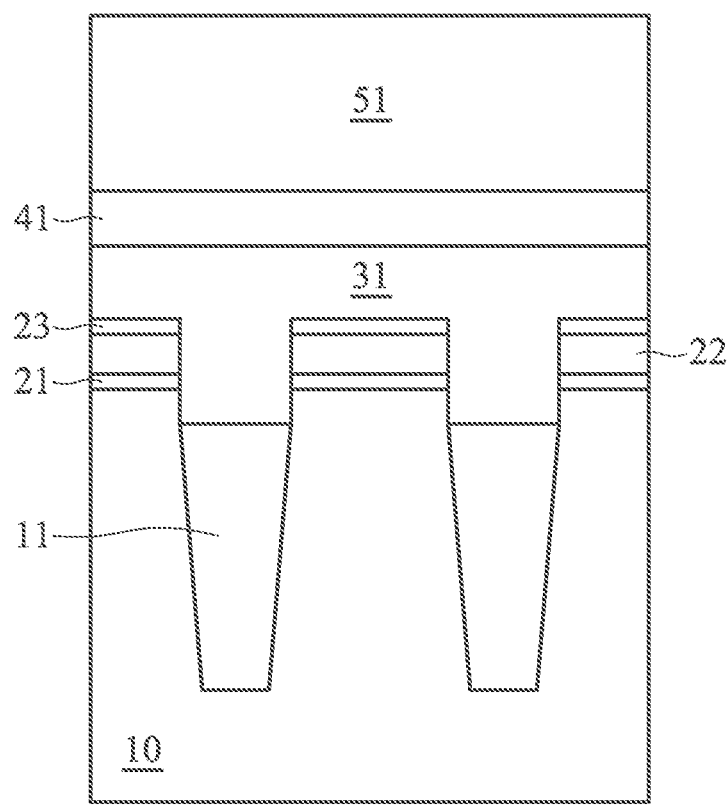
Figure 1D:
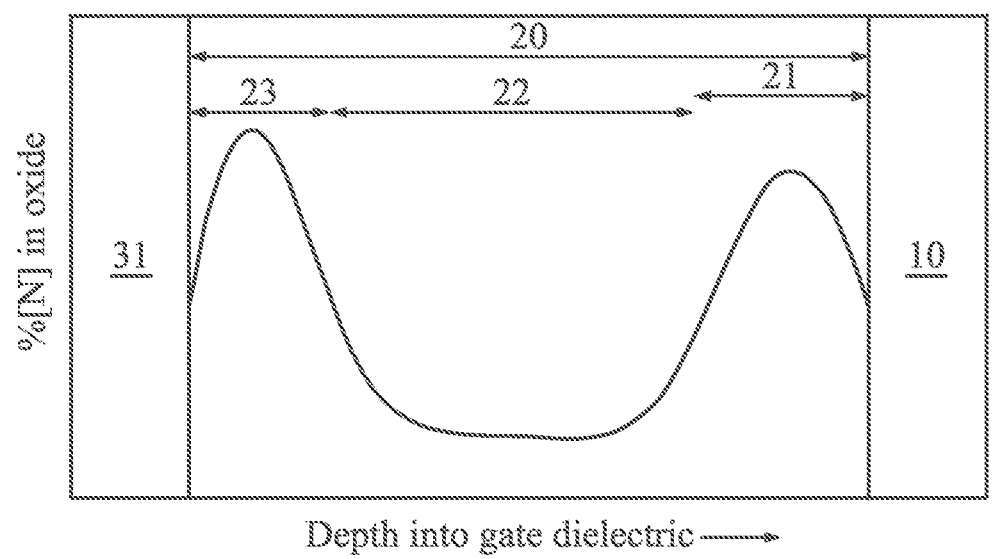

FIG. 1, which includes FIGS. 1a-1d, illustrates a structural embodiment of a semiconductor non-volatile memory device, in accordance with embodiments of the invention, wherein FIG. 1a illustrates a top view, wherein FIGS. 1b and 1c illustrate cross-sectional views, and wherein FIG. 1d is a schematic illustration of nitrogen profile in the gate dielectric of the memory device.

Referring now to FIG. 1a, the non-volatile memory device comprises source/drain regions 61 separated by isolation regions 11. The non-volatile memory device further comprises a control gate 51 disposed above doped source/drain regions 61.

Referring to the cross-sectional view of FIG. 1b, a channel 62 is disposed between the source/drain regions 61 underneath a gate dielectric region 20. The gate dielectric region 20 is disposed over the channel 62 and comprises a first dielectric layer 21, a second dielectric layer 22, and a third dielectric layer 23. In various embodiments, the first dielectric layer 21, the second dielectric layer 22, and the third dielectric layer 23 comprise different nitrogen compositions. In particular, the second dielectric layer 22 comprises a lower nitrogen composition than the first and the third dielectric layers 21 and 23. In various embodiments, the first and the third dielectric layers 21 and 23 comprise a nitrogen composition of at least 1% and less than 20%. In one embodiment, the first and the third dielectric layers 21 and 23 comprise a nitrogen composition of about 8% to about 16%.

A stack comprising a floating gate 31, an inter gate dielectric 41, and a control gate 51 are disposed over the gate dielectric region 20 forming a floating gate memory device. The spacers 53 cover the exposed sidewalls of the electrodes, and avoid shorting of the control gate 51 with the floating gate 31. The control gate 51 and the source/drain regions 61 are coupled to corresponding potentials, while the floating gate 31 is floating.

Referring to FIG. 1c, the control gate line 51 may extend over multiple active regions separated by isolation regions 11.

FIG. 1d illustrates a nitrogen profile in a gate dielectric region 20 of the non-volatile memory device. FIG. 1d represents an illustration of the chemical composition of nitrogen (y-axis) within the gate dielectric region 20 (x-axis). The first dielectric layer 21 is disposed on the substrate 10, while a floating gate 31 is disposed over the third dielectric layer 23. The gate dielectric region 20 thus comprises two nitrogen peaks or nitrogen rich regions disposed on either side of the gate dielectric region 20 (referred subsequently as non-uniform double peak nitrogen profile). The first dielectric layer 21 represents the first nitrogen rich region and the third dielectric layer 23 represents the second nitrogen rich region. The nitrogen peak concentration varies from about 5% to about 50% in various embodiments. In various embodiments, the nitrogen content of the first dielectric layer 21 and the third dielectric layer 23 may be different.

During erase operation, traps adjacent the substrate 10/gate dielectric region 20 are activated. A high nitrogen content adjacent this substrate 10/gate dielectric region 20 interface ensures reduced hole trapping during erase operation of the non-volatile memory. Similarly, during program operation, electron traps adjacent the floating gate 31 and the gate dielectric region 20 interface are activated. A high nitrogen content adjacent this floating gate 31/gate dielectric region 20 interface ensures reduced charge trapping during program operation of the non-volatile memory. Hence, in various embodiments, the non-uniform double peak nitrogen profile improves endurance of the non-volatile memory device.

FIG. 2, which includes FIGS. 2a-2h, illustrates a non-volatile memory in various stages of fabrication, in accordance with an embodiment of the invention.

Figure 2A:
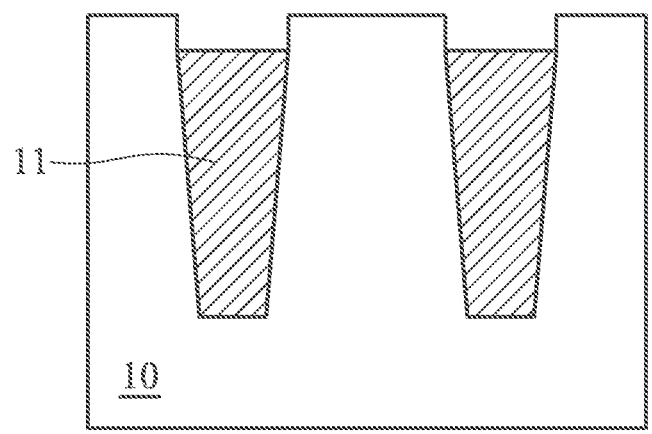
FIGS. 2a-2h, illustrates a non-volatile memory in various stages of fabrication, in accordance with embodiments of the invention.
Figure 2B:
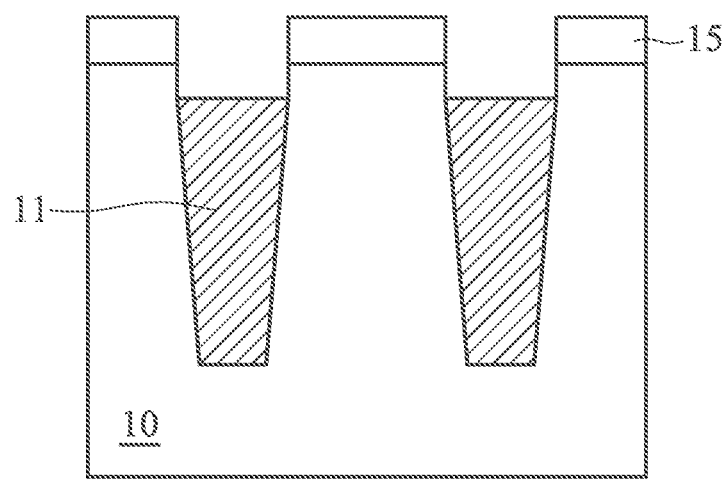

Referring to FIG. 2a, isolation trenches are formed in the substrate 10. The substrate 10 is a silicon wafer in one embodiment. In other embodiments, the substrate 10 comprises a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In alternative embodiments, other semiconductors such as silicon germanium, germanium, gallium arsenide, indium arsenide, indium gallium arsenide, indium antimonide or others can be used as the substrate 10.

Conventional techniques may be used to form isolation trenches (not shown). For example, a hard mask layer (not shown here), such as silicon nitride, can be formed over the semiconductor substrate 10 and patterned to expose the isolation areas. The exposed portions of the semiconductor substrate 10 can then be etched to the appropriate depth, which is typically between about 200 nm and about 400 nm. The isolation trenches define active areas of the semiconductor device being fabricated.

As illustrated in FIG. 2a, the isolation trenches are filled with an isolating material forming shallow trench isolation 11. For example, exposed silicon surfaces can be thermally oxidized to form a thin oxide layer. The isolation trenches can then be lined with a first material such as a nitride layer (e.g., $Si_3N_4$). The isolation trenches can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with other fill materials.

The substrate 10 is prepared by suitable cleaning such as treating with diluted hydrofluoric acid. For example, the surface may be cleaned using a buffered hydrofluoric acid (BHF) clean followed by an $NH_4OH$ clean followed by an HCl clean. An insulating layer 15 is deposited over the substrate 10. In various embodiments, the insulating layer 15 comprises an oxide layer thermally grown from the substrate 10. In various embodiments, the insulating layer 15 may be formed using the rapid thermal oxidation (RTO) process at temperatures ranging from 800° C. to about 1100° C. The oxidation may be performed in oxygen or in a combination of oxygen with other gases such as ammonia, nitric oxide, and/or nitrous oxide.

In one embodiment, the insulating layer 15 comprises a silicon dioxide layer fabricated using an in situ steam generation (ISSG) oxidation by treating with a gas containing hydrogen and oxygen atoms. In various embodiments, an insulating layer 15 comprising silicon dioxide is thermally grown in a steam ambient, at a temperature between about 600° C. to about 900° C., resulting in a physical thickness of about 30 Å to about 150 Å. In other embodiments, a high temperature oxidation may be performed, for example, using a chemical vapor deposition (CVD) process to form the insulating layer 15.

Figure 2C:
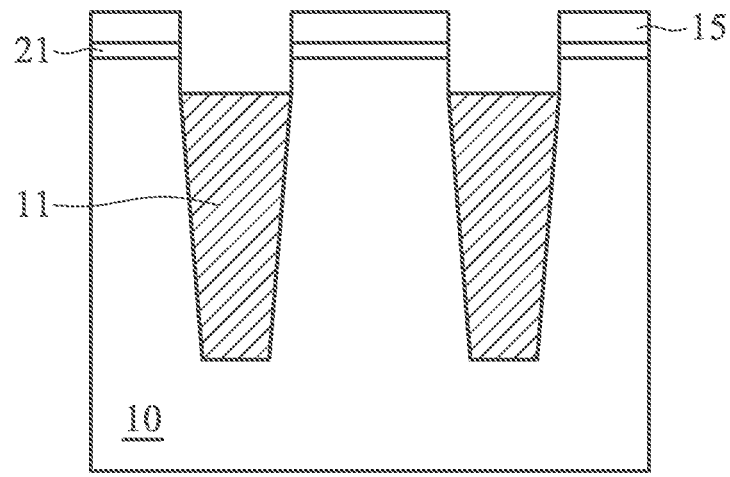

The oxidation is followed by a gas phase nitridation process that converts a portion of the insulating layer 15 into a first dielectric layer 21 as illustrated in FIG. 2c. The nitridation process forms a nitrogen rich region near the interface between the insulating layer 15 and the substrate 10. In various embodiments, the gas phase nitridation may comprise heating between about 0.1 minutes to about 10 minutes at a temperature between about 800° C. and 1,000° C. in an atmosphere of ammonia, nitrous oxide, and/or nitric oxide. In one embodiment, an in situ anneal process in a NO ambient, at a temperature between about 800° C. to about 1000° C., for a time between about 20 seconds to 120 seconds, is used to form the first dielectric layer 21.

Figure 2D:
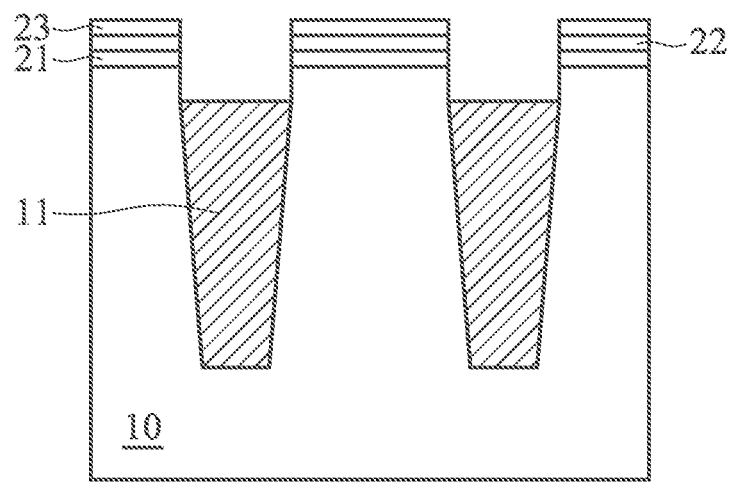

Referring to FIG. 2d, a plasma nitridation is performed to form the second dielectric layer 22 and the third dielectric layer 23. The plasma nitridation forms a nitrogen rich region adjacent to the interface with the gas phase.

In one embodiment, a decoupled plasma nitridation is used to form the third dielectric layer 23 by converting the insulating layer 15 into the second and the third dielectric layers 22 and 23. Decoupled plasma nitridation (DPN) incorporates ultra-high concentrations of nitrogen at the top surface layer in a single step using inductive coupling for forming the plasma.

In one embodiment, a decoupled plasma nitridation process at a temperature between about 15° C. to about 50° C. in an ambient of He and $N_2$ may be used. The power of the DPN process may be selected between about 200 W to about 2000 W, along with a substrate bias of between about 0.0-1.0 kV. A pressure between about 5 mTorr to about 100 mTorr for about 5-300 seconds, a nitrogen flow rate of between about 10 sccm to about 1000 sccm, a helium flow rate of about 100 sccm to about 3,000 sccm may be used in various embodiments.

In an alternative embodiment, a remote plasma nitridation process is used to form the third dielectric layer 23. In one embodiment, a remote plasma nitridation (RPN) process at a temperature between about 50° C. to about 600° C. in ambient of $N_2O$, NO, or $N_2$ may be used. The power of the RPN process may be selected between approximately about 50 W to about 5000 W, along with a substrate bias of between about 0.0 kV to about 1.0 kV. A pressure between about 5 mTorr to about 760 Torr for about 5-300 seconds and a gas flow rate of between about 10 sccm to about 1000 sccm with an $N_2$ precursor may be used in various embodiments. In various embodiments, other nitridation processes such as high density plasma nitridation may also be used.

After the nitridation, a post nitridation anneal (PNA) is performed in an ambient of $O_2$ or $N_2$. The PNA is performed at high temperatures to remove the defects introduced during the nitridation processes. In various embodiments, the anneal temperature is about 950° C. to about 1150° C. for about 10 minutes to about 60 minutes. In one embodiment, the thermal budget of the PNA is chosen to enable relaxation of the oxide network by viscous flow of the oxide. PNA anneal helps to repair surface damage caused by the plasma nitridation process and reduces oxide traps in the oxide bulk film.

A floating gate layer 32 is then deposited across the whole substrate 10. This forms the floating gate electrode over the gate dielectric region 20. The floating gate layer 32 preferably comprises a semiconductor material, such as polysilicon or amorphous silicon, although alternatively, other semiconductor materials may be used for the floating gate layer 32. In other embodiments, the floating gate layer 32 may comprise TiN, TiC, HfN, TaN, TaC, W, Al, Ru, RuTa, TaSiN, NiSi$_x$, CoSi$_x$, TiSi$_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, other metals, and/or combinations thereof, as examples.

While only a single layer is illustrated, in various embodiments, the floating gate layer 32 may comprise a plurality of stacked gate materials, such as a metal underlayer with a polysilicon cap layer disposed over the metal underlayer. The floating gate layer 32 comprises a thickness between about 100 Å to about 2000 Å, and deposited using CVD, PVD, ALD, or other deposition techniques.

In one embodiment, the floating gate layer 32 comprises a doped polysilicon layer. If the floating gate layer 32 comprises polysilicon, it may be doped with a suitable n or p type dopant. For example, an n-type gate electrode may be formed by depositing phosphorus doped floating gate layer 32. In some cases, the polysilicon layer may be doped by implanting a suitable dopant. Typically, n-type electrodes may be in situ doped during deposition by depositing doped polysilicon comprising phosphorus, arsenic, and/or antimony. Similarly, p-type electrodes may be formed by implanting atoms comprising boron and/or BF$_2$.

Figure 2E:
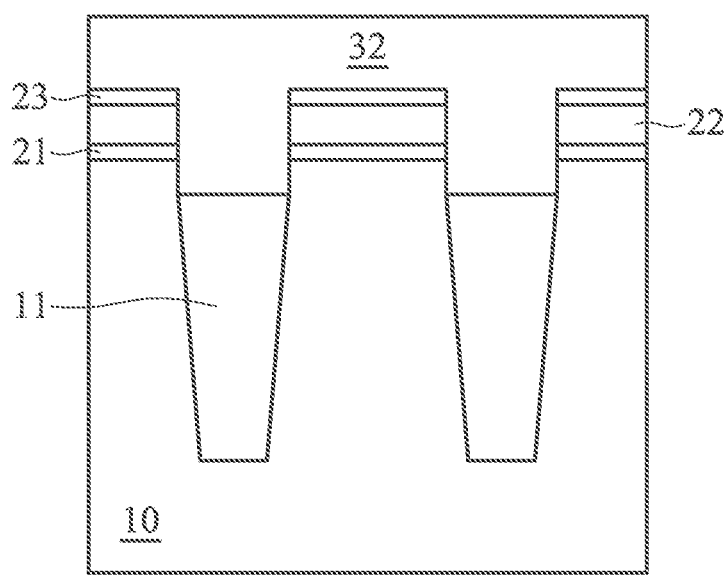
Figure 2F:
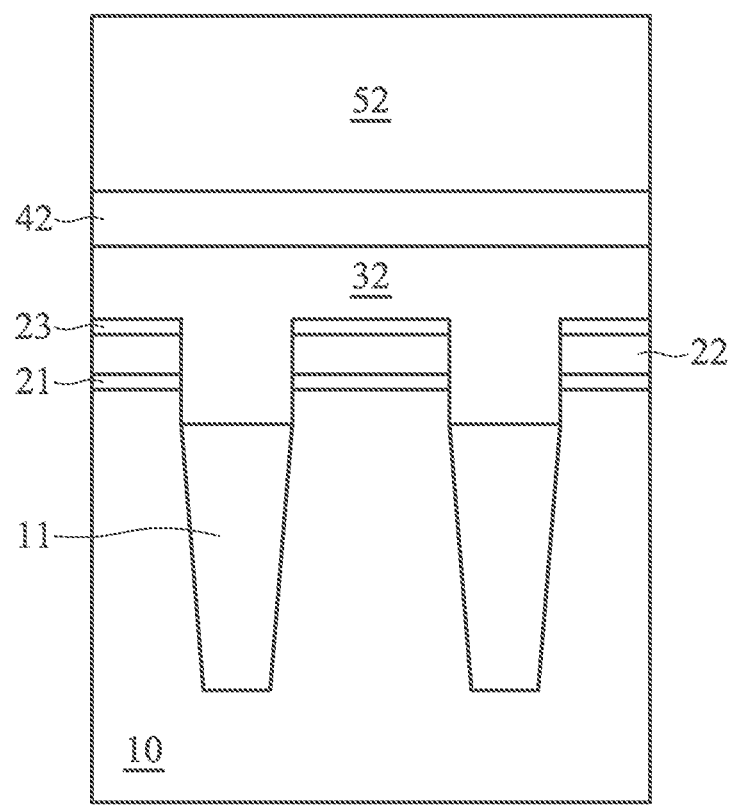

As illustrated in FIG. 2f, an inter gate dielectric layer 42 is then deposited over the floating gate layer 32. In one embodiment, the inter gate dielectric layer 42 comprises silicon dioxide. In an alternative embodiment, the inter gate dielectric layer 42 comprises Al$_2$O$_3$. In various embodiments, the inter gate dielectric layer 42 comprises a suitable high-k dielectric layer such as HfO$_2$, HfSiO$_x$, ZrO$_2$, ZrSiO$_x$, Ta$_2$O$_5$, La$_2$O$_3$, nitrides thereof, HfAlO$_x$, HfAlO$_x$N$_{1-x-y}$, ZrAlO$_x$, ZrAlO$_x$N$_y$, SiAlO$_x$, SiAlO$_x$N$_{1-x-y}$, HfAlSiO$_x$, HfAlSiO$_x$N$_y$, ZrSiAlO$_x$, ZrSiAlO$_x$N$_y$, combinations thereof, or combinations thereof with SiO$_2$, as examples. To avoid charge trap levels near the floating gate interface, a thin oxide layer is deposited before the high-k deposition. In some embodiments, an additional oxide layer on top of the high-k layer may also be used.

Referring to FIG. 2f, a control gate layer 52 is deposited across the whole semiconductor substrate 10. Similar to the floating gate material, the control gate layer 52 may comprise poly silicon or metallic layers. In one embodiment, the control gate layer 52 is an n-type poly silicon layer. Again, this may be implanted with a suitable dopant. An anneal may be introduced to produce a uniform profile in the polysilicon layers and reduce traps and defects in the dielectric materials.

Figure 2G:
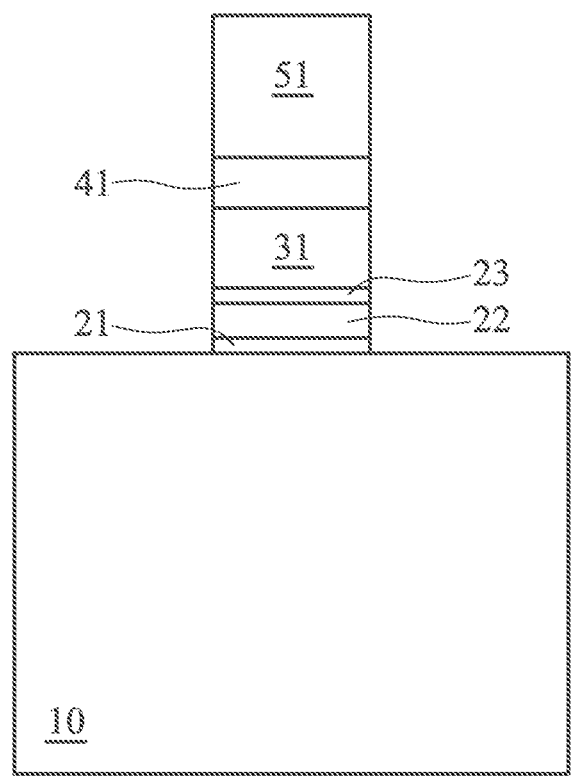

As next illustrated in cross-sectional views along the current flow direction in FIG. 2g, the gate stack layers (the control gate layer 52, the inter gate dielectric layer 42, and the floating gate layer 32) are next patterned and exposed using known photolithography techniques. The control gate layer 52 is etched to form a control gate 51. Similarly, the inter gate dielectric layer 42 forms an inter gate dielectric 41, and the floating gate layer 32 forms a floating gate 31.

Figure 2H:
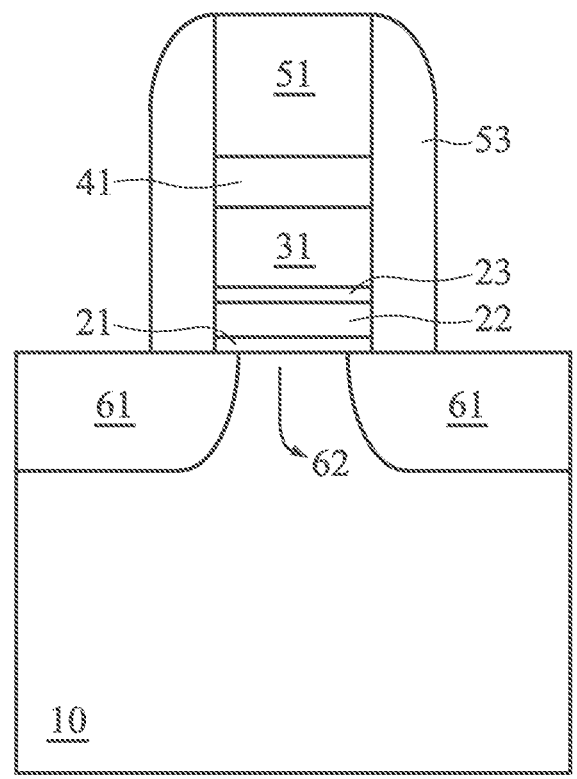

Referring to FIG. 2h, spacers 53 and source/drains regions 61 are formed. The spacers 53 are formed using conventional processing, for example, by the deposition of a conformal layer followed by an anisotropic etch. The process can be repeated for multiple layers, as desired. In some cases, oxidation may be used to form the spacers 53.

In some embodiments, the source/drain regions 61 may be formed by forming a recess in the substrate 10 followed by an epitaxial deposition of a semiconductor material.

The device is exposed to a source/drain ion implant in forming the source/drain regions 61. If a p-type transistor is to be formed, a p-type ion implant is used to form the heavily doped source/drain regions 61. Alternatively, if an n-type transistor is to be formed, an n-type ion implant is used to form the heavily doped source/drain regions 61. The source/drain ion implant may comprise a plurality of implants in various embodiments.

A source/drain anneal follows the source/drain implants. In various embodiments, the source/drain anneal is performed at a temperature between about 700° C. and about 1200° C., for a time between about 0.1 ms and about 1 s. The source/drain anneal may comprise multiple heating cycles in different types of furnaces, for example, a combination of a spike anneal and a flash or laser anneal in one embodiment.

Subsequent processing follows conventional processing in forming silicide regions on the source/drain regions 61, and the control gate 51. Further processing continues as in a typical integrated chip manufacturing process. For example, typically, gate electrode contacts are formed through an inter-level dielectric layer. Metallization layers that interconnect the various components are also included in the chip, but are not illustrated herein for the purpose of simplicity.

Figure 3A:
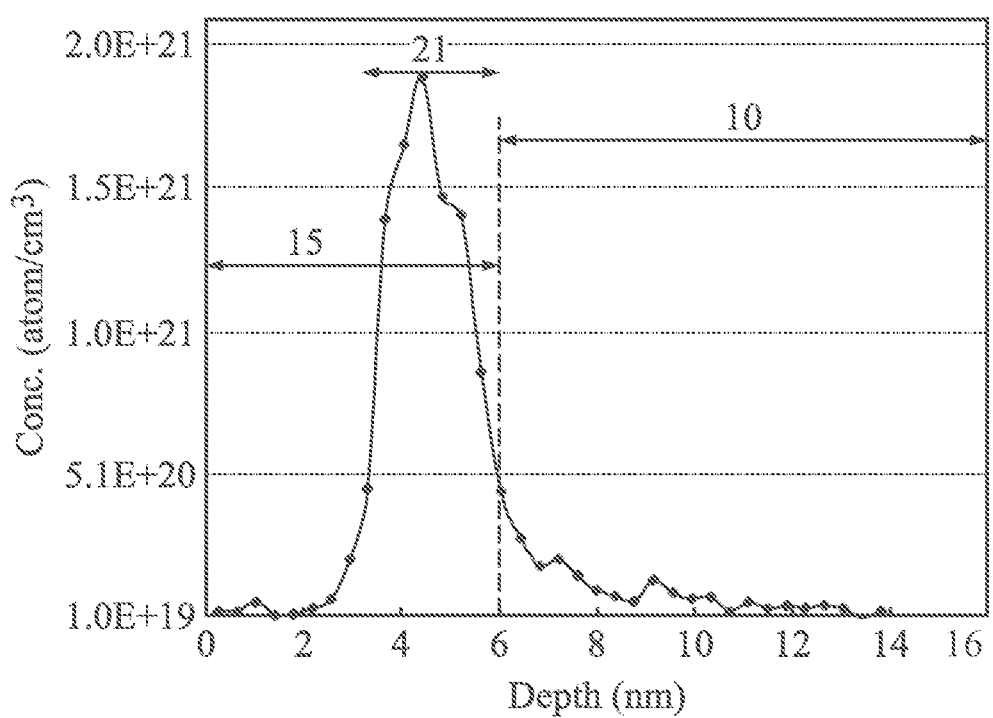
FIGS. 3a and 3b, illustrates a secondary ion mass spectrometry (SIMS) profile of a gate dielectric layer in various stages of fabrication using embodiments of the invention.
Figure 3B:
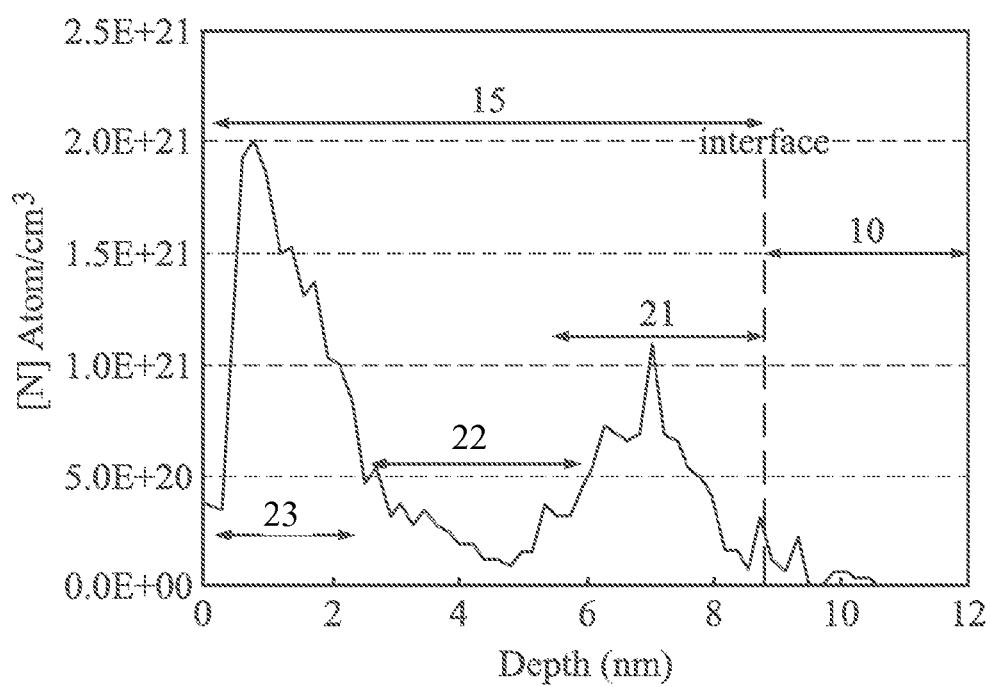

FIG. 3, which includes FIGS. 3a and 3b, illustrates a secondary ion mass spectrometry (SIMS) profile of a gate dielectric layer in various stages of fabrication using embodiments of the invention.

FIG. 3a illustrates the nitrogen concentration after a gas phase nitrogen anneal, for example, after a NO anneal as illustrated in FIG. 2c. The depth profile of nitrogen extending into the substrate 10 is shown. Hence, an insulating layer 15 is disposed above a substrate 10. The interface between the insulating layer 15 and the substrate 10 is illustrated by the dashed line. The gas phase anneal forms a nitrogen rich region (a first dielectric layer 21) disposed within the insulating layer 15. The nitrogen rich region is disposed adjacent the interface between the insulating layer 15 and the substrate 10.

FIG. 3b illustrates a nitrogen profile after a plasma nitridation process, for example, as illustrated in FIG. 2d. Again, the insulating layer 15 is disposed above the substrate 10. The first nitrogen rich region (a first dielectric layer 21, as illustrated in FIG. 3a, and/or 2c) formed by the prior gas phase anneal (e.g., NO anneal) is retained while a second nitrogen rich region (a third dielectric layer 23) is formed within the insulating layer 15. Unlike, the first nitrogen rich region which is disposed adjacent the interface between the insulating layer 15 and the substrate 10, the second nitrogen rich region is disposed adjacent the top surface of the insulating layer 15. Hence, using a two step nitridation process, a non-uniform nitrogen profile is formed. In one embodiment, a "U" shaped nitrogen profile is formed. In various embodiments, the nitrogen concentration in the two peaks may be varied by changing the nitridation process parameters.

Figure 4A:
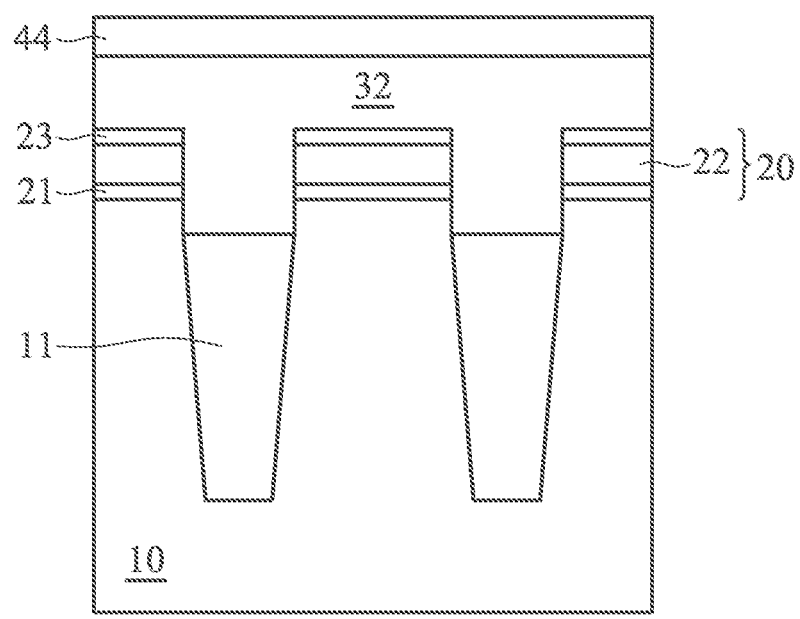
FIGS. 4a-4c, illustrates a non-volatile memory in various stages of fabrication, in accordance with embodiments of the invention.
Figure 4B:
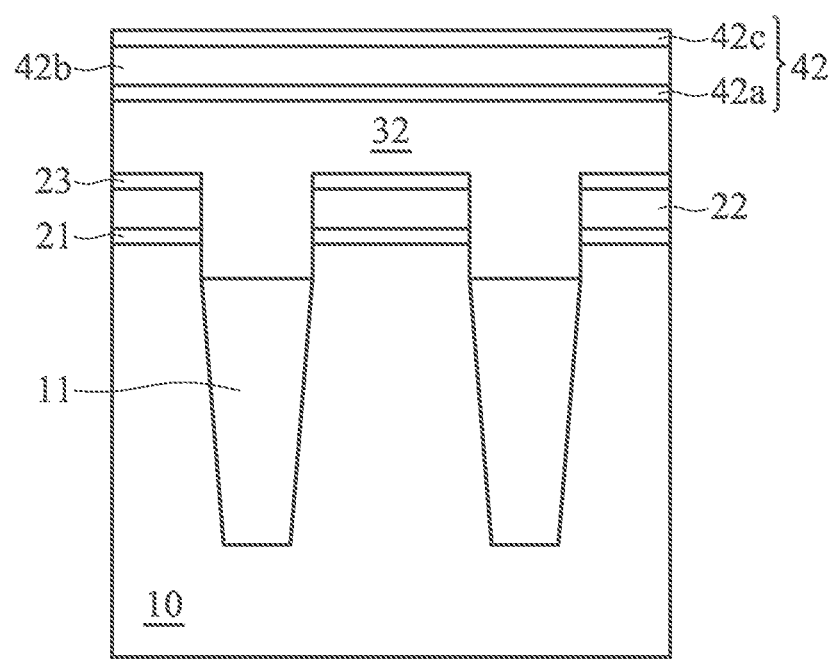
Figure 4C:
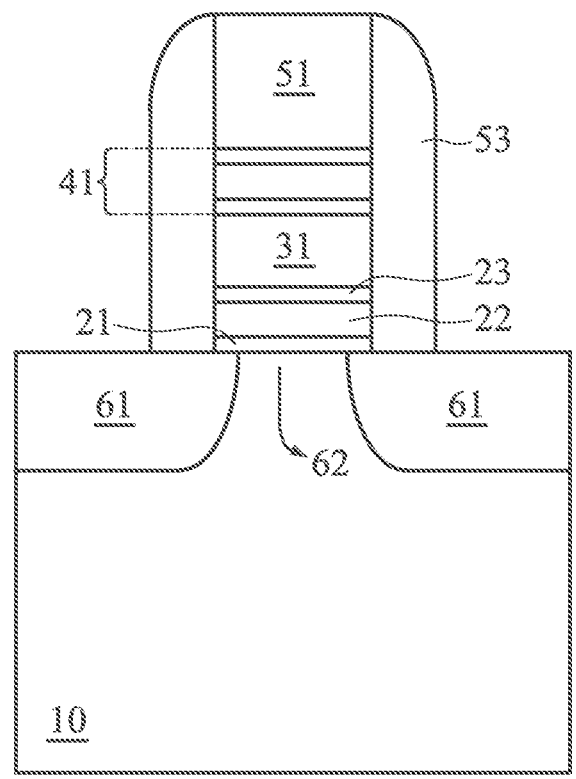

FIG. 4, which includes FIGS. 4a-4c, illustrates a semiconductor device in various stages of fabrication, in accordance with an embodiment of the invention.

This embodiment follows the prior embodiment from FIG. 2a-2e thus forming the shallow trench isolation 11, the gate dielectric region 20 comprising a first, second, third dielectric layers 21, 22, and 23 using a two step nitridation anneal.

After depositing the floating gate layer 32 as described in FIG. 2e, the inter gate dielectric precursor layer 44 is formed. In one embodiment, the inter gate dielectric precursor layer 44 comprises silicon dioxide.

In various embodiments, the inter gate dielectric precursor layer 44 is thermally grown on the floating gate layer 32. In various embodiments, the inter gate dielectric precursor layer 44 may be formed using a RTO process at temperatures ranging from 800° C. to about 1100° C. The oxidation may be performed in oxygen or a combination of oxygen with other gases such as ammonia, nitric oxide, nitrous oxide.

In various embodiments, the inter gate dielectric precursor layer 44 is thermally grown in a steam ambient, at a temperature between about 600° C. to about 900° C., resulting in a physical thickness of about 30 Å to about 200 Å. In one embodiment, the inter gate dielectric precursor layer 44 is fabricated using an in situ steam generation (ISSG) oxidation by treating with a gas containing hydrogen and oxygen atoms. In other embodiments, a high temperature oxidation may be performed, for example, using a chemical vapor deposition (CVD) process to form the inter gate dielectric precursor layer 44.

Referring to FIG. 4b, the oxidation is followed by a two step nitridation process forming an inter gate dielectric layer 42 comprising a first inter gate dielectric layer 42a, a second inter gate dielectric layer 42b, and a third inter gate dielectric layer 42c.

The first nitridation process comprises a gas phase nitridation, and a thermal nitridation process in one embodiment. The first nitridation process converts a portion of the inter gate dielectric precursor layer 44 into a first inter gate dielectric layer 42a as illustrated in FIG. 4b. The nitridation process forms a first nitrogen rich region near the interface between the inter gate dielectric precursor layer 44 and the floating gate layer 32 (as illustrated in FIG. 3a).

In various embodiments, the first nitridation may comprise heating between about 0.1 minutes to about 10 minutes at a temperature between about 800° C. and 1,000° C. in an atmosphere of ammonia, nitrous oxide, and/or nitric oxide. In one embodiment, another in situ anneal process in a NO ambient, at a temperature between about 800° C. to about 1000° C., for a time between about 20 seconds to 50 seconds is used to form the first inter gate dielectric layer 42a.

A second nitridation follows the first nitridation. The second nitridation comprises a plasma nitridation, and forms a second nitrogen rich region within the inter gate dielectric precursor layer 44. Second and third inter gate dielectric layers 42b and 42c are formed after the second nitridation process. In one embodiment, the second nitridation comprises a decoupled plasma nitridation process. The second nitridation process may be followed by a high temperature anneal to remove defects formed due to the plasma nitridation. In some embodiments, the high temperature anneal performed after the second nitridation forming the second and third dielectric layers 22 and 23 may be skipped. Instead, a single high temperature anneal may be performed to improve the reliability of both the gate dielectric region 20 and the inter gate dielectric layer 42.

As illustrated in FIG. 4c, subsequent processing continues as described in FIGS. 2f-2h. For example, a control gate layer is deposited and the resulting gate stack patterned to form a control gate 51, the inter gate dielectric 41, and the floating gate 31. After forming spacers 53, source/drain regions 61 are formed separating a channel 62.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A non-volatile memory device comprising:
a gate dielectric layer disposed over a semiconductor substrate, the gate dielectric layer comprising a non-uniform nitrogen profile, the non-uniform nitrogen profile comprising:
a first nitrogen rich region disposed immediately adjacent a bottom surface of the gate dielectric layer, the first nitrogen rich region having a first peak nitrogen concentration, the first nitrogen peak concentration being spaced from a first interface between the first nitrogen rich region and the semiconductor substrate; and
a second nitrogen rich region disposed adjacent a top surface of the gate dielectric layer, the top surface being opposite the bottom surface, the second nitrogen rich region being separated from the first nitrogen rich region by a low nitrogen region, the second nitrogen rich region having a second peak nitrogen concentration;
a first gate electrode disposed on the top surface of the gate dielectric layer, the second nitrogen peak concentration being spaced from a second interface between the second nitrogen rich region and the first gate electrode, the low nitrogen region having a nitrogen concentration less than the nitrogen concentration at the first interface and the second interface; and
an inter-level gate dielectric disposed over the first gate electrode, wherein the inter-level gate dielectric comprises:
a first oxide layer;
a high-k dielectric layer on the first oxide layer, the high-k dielectric layer having a different material composition than the first oxide layer; and
a second oxide layer on the high-k dielectric layer, the second oxide layer having a different material composition than the high-k dielectric layer.

2. The device of claim 1, further comprising:
a second gate electrode disposed over the inter-level gate dielectric, wherein the first gate electrode is floating, and wherein the second gate electrode is coupled to a control gate potential node.

3. The device of claim 1, wherein the first nitrogen rich region comprises at least about 5% nitrogen, and wherein the second nitrogen rich region comprises at least about 5% nitrogen.

4. The device of claim 1 further comprising:
gate spacers on opposite sidewalls of the gate dielectric layer and the first gate electrode; and
source/drain regions in the semiconductor substrate, the source/drain regions extending under the gate spacers and the gate dielectric layer.

5. The device of claim 1, wherein the second peak nitrogen concentration is a different concentration value than the first peak nitrogen concentration.

6. The device of claim 1, wherein the high-k dielectric layer comprises at least one of $HfO_2$, $HfSiO_x$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfAlSiO_x$, $HfAlSiO_xN_y$, $ZrSiAlO_x$, $ZrSiAlO_xN_y$, combinations thereof, and combinations thereof with $SiO_2$.

7. A non-volatile memory device comprising:
- a first gate dielectric layer on a semiconductor substrate, the first gate dielectric layer comprising:
  - a first nitrogen rich region disposed immediately adjacent the semiconductor substrate, the first nitrogen rich region having a first nitrogen concentration in the first nitrogen rich region and a second nitrogen concentration at a first interface between the first nitrogen rich region and the semiconductor substrate, the first nitrogen concentration being greater than the second nitrogen concentration; and
  - a second nitrogen rich region separated from the first nitrogen rich region by a low nitrogen region, the second nitrogen rich region having a third nitrogen concentration in the second nitrogen rich region;
- a first gate electrode disposed on the second nitrogen rich region, the second nitrogen rich region having a fourth nitrogen concentration at a second interface between the second nitrogen rich region and the first gate electrode, the third nitrogen concentration being greater than the fourth nitrogen concentration, the low nitrogen region having a lower nitrogen concentration than both the second nitrogen concentration and the fourth nitrogen concentration;
- a second gate dielectric layer on the first gate electrode; and
- a second gate electrode on the second gate dielectric layer.

8. The device of claim 7, wherein the first gate electrode is floating, and wherein the second gate electrode is coupled to a control gate potential node.

9. The device of claim 7, wherein the first nitrogen rich region comprises from about 5% to about 50% nitrogen, and wherein the second nitrogen rich region comprises from about 5% to about 50% nitrogen.

10. The device of claim 7, wherein the second gate dielectric layer comprises:
- a third nitrogen rich region disposed immediately adjacent the first gate electrode, and
- a fourth nitrogen rich region, the fourth nitrogen rich region being separated from the third nitrogen rich region by a low nitrogen region, the second gate electrode being on the fourth nitrogen rich region.

11. The device of claim 10, wherein the third nitrogen rich region comprises from about 5% to about 50% nitrogen, and wherein the fourth nitrogen rich region comprises from about 5% to about 50% nitrogen.

12. The device of claim 10 further comprising:
- source/drain regions in the semiconductor substrate, the source/drain regions extending partially under the first gate dielectric layer; and
- gate spacers along sidewalls of the first gate dielectric layer, the first gate electrode, the second gate dielectric layer, and the second gate electrode, the gate spacers being on the source/drain regions.

13. The device of claim 7, wherein the third nitrogen concentration is a different concentration value than the first nitrogen concentration.

14. A semiconductor device comprising:
- a first gate dielectric layer on a semiconductor substrate, the first gate dielectric layer comprising:
  - a first nitrogen rich layer on the semiconductor substrate, the first nitrogen rich layer having a first peak nitrogen concentration, the first nitrogen peak concentration being spaced from a first interface between the first nitrogen rich layer and the semiconductor substrate;
  - a first dielectric layer on the first nitrogen rich layer; and
  - a second nitrogen rich layer on the first dielectric layer, the second nitrogen rich layer having a second peak nitrogen concentration;
- a first gate electrode disposed on the second nitrogen rich layer, the second nitrogen peak concentration being spaced from a second interface between the second nitrogen rich layer and the first gate electrode, the first dielectric layer having a nitrogen concentration less than the nitrogen concentration at the first interface and the second interface;
- a second gate dielectric layer on the first gate electrode, the second gate dielectric layer comprising:
  - a third nitrogen rich layer on the first gate electrode, the third nitrogen rich layer having a third peak nitrogen concentration, the third nitrogen peak concentration being spaced from a third interface between the third nitrogen rich layer and the first gate electrode;
  - a second dielectric layer on the third nitrogen rich layer; and
  - a fourth nitrogen rich layer on the second dielectric layer, the fourth nitrogen rich layer having a fourth peak nitrogen concentration; and
- a second gate electrode on the fourth nitrogen rich layer, the fourth nitrogen peak concentration being spaced from a fourth interface between the fourth nitrogen rich layer and the second gate electrode, the second dielectric layer having a nitrogen concentration less than the nitrogen concentration at the third interface and the fourth interface.

15. The device of claim 14, wherein the third nitrogen rich layer comprises at least about 5% nitrogen, and the fourth nitrogen rich layer comprises at least about 5% nitrogen.

16. The device of claim 14, wherein first dielectric layer has a lower nitrogen concentration than the first nitrogen rich layer and the second nitrogen rich layer, and wherein the second dielectric layer has a lower nitrogen concentration than the third nitrogen rich layer and the fourth nitrogen rich layer.

17. The device of claim 14, wherein the first gate electrode is floating, and wherein the second gate electrode is coupled to a control gate potential node.

18. The device of claim 14 further comprising:
- source/drain regions in the semiconductor substrate, the source/drain regions extending partially under the first gate dielectric layer; and
- gate spacers along sidewalls of the first gate dielectric layer, the first gate electrode, the second gate dielectric layer, and the second gate electrode, the gate spacers being on the source/drain regions.

19. The device of claim 14, wherein the first nitrogen rich layer comprises about 8% to about 16% nitrogen and the second nitrogen rich layer comprises about 8% to about 16% nitrogen.

20. The device of claim 14, wherein the first nitrogen rich layer comprises at least about 5% nitrogen and the second nitrogen rich layer comprises at least about 5% nitrogen.

* * * * *